United States Patent [19]

Sakui et al.

[11] Patent Number: 4,926,382
[45] Date of Patent: May 15, 1990

[54] DIVIDED BIT LINE TYPE DYNAMIC RANDOM ACCESS MEMORY WITH CHARGING/DISCHARGING CURRENT SUPPRESSOR

[75] Inventors: Koji Sakui, Tokyo; Kazunori Ohuchi; Fujio Masuoka, both of Yokohama, all of Japan

[73] Assignee: Kabushiki Kaisha Toshiba, Kawasaki, Japan

[21] Appl. No.: 275,395

[22] Filed: Nov. 23, 1988

[30] Foreign Application Priority Data

Nov. 25, 1987 [JP] Japan ................. 62-296824

[51] Int. Cl.⁵ .................. G11C 7/00; G11C 11/24
[52] U.S. Cl. .................... 365/203; 365/149; 365/189.01; 365/205; 365/208; 365/210
[58] Field of Search ........... 365/189, 203, 208, 205, 365/210, 230, 149, 189.01, 230.01

[56] References Cited

U.S. PATENT DOCUMENTS 4,748,591 5/1988 Itoh et al. ................. 365/189
4,777,625 10/1988 Sakui et al. ................ 365/207

Primary Examiner—James W. Moffitt
Attorney, Agent, or Firm—Oblon, Spivak, McClelland, Maier & Neustadt

[57] ABSTRACT

A divided bit line type dynamic semiconductor memory device comprises parallel main bit line pairs, divided bit line pairs provided at each main bit line pair, parallel word lines insulatively crossing the divided bit line pairs, and memory cells provided at the cross points between the divided bit line pairs and the word lines. First sense amplifiers are coupled to the divided bit line pairs. Second sense amplifiers are coupled to the main bit line pairs. First transfer gate sections are coupled between the divided bit line pairs and the main bit line pairs, respectively. Second transfer gate sections are coupled between the main bit line pairs and the second sense amplifier circuits, respectively. A charging/discharging current suppressor is provided which, in both of the read and restoring modes, restricts the amplitude of the potential change, due to charging/discharging, of a specifi main bit line pair associated with a selected divided bit line pair including a selected cell to be smaller than a full potential change defined by the source voltage and ground potential of the device, whereby a charging/discharging cuffent flowing through the specific main bit line pair is reduced so that the dissipation power of the dRAM is saved and its operation speed is improved.

18 Claims, 2 Drawing Sheets

DIVIDED BIT LINE TYPE DYNAMIC RANDOM ACCESS MEMORY WITH CHARGING/DISCHARGING CURRENT SUPPRESSOR

BACKGROUND OF THE INVENTION

1. Field of the Invention

The present invention relates to a semiconductor memory device, and, in particular, to a divided bit line type dynamic random access memory having plural pairs of main bit lines each of which has sub-bit lines coupled thereto through respective transfer gates.

2. Description of the Related Art

With the increasing demand for high performance and reliability of large digital system, techniques for highly integrated dynamic random access memories (hereinafter referred to as "dRAM's") become indispensable. The divided bit line technique, one of such techniques, is considered promising to provide super large scaled dRAM's. According to this technique, each of parallel bit line pairs formed on a chip substrate is coupled with plural pairs of sub-bit lines. Each sub-bit line has a given number of memory cells coupled thereto and is coupled to the associated main bit line pair through the respective transfer gate. When a memory cell is selected, the transfer gate of the sub-bit line pair including this selected cell is opened and a data voltage from the selected cell is supplied to the associated main bit line pair. A sense amplifier provided to this main bit line pair amplifies the cell data voltage and outputs the amplified data voltage onto output lines.

Such a type of dRAM is, however, facing the problem of making it difficult to reduce dissipation power and increase the data accessing speed. According to the conventional divided bit line type dRAM, charging/discharging occurs on a main bit line pair having a several times larger capacity than a divided bit line every time data readout from, and data restoring in, a memory cell is executed, thus increasing the dissipation power of the dRAM. In addition, at the time of data reading from or data restoring in the dRAM, the main bit line pair remains coupled to both of the sense amplifier for the main bit lines and the associated divided bit lines until the main bit line pair is completely charged or discharged so that it has the upper limit or lower limit potential of the full potential variation range corresponding to the potential difference between the source voltage Vdd and ground potential Vss. As a result, the capacitive load on this main bit line pair is undesirably increased. This delays the data restoring in the memory cell of a selected divided bit line and/or delays the sensing operation of the main bit line sense amplifier, thus deteriorating the high speed operation of the dRAM.

The following specifically describes the above problem with reference to a 16 megabit dRAM designed using the conventional divided bit line structure. Given that each of 2048 main bit line pairs is coupled with 8 divided bit lines each having 256 memory cells, the capacity of the main bit line pair is 3 to 4 picofarads (pF) and the capacity of each divided bit line is 0.6 to 1 pF. With the one cycle time of the reading operation of the dRAM being 200 nanoseconds, the charging/discharging current flowing through the main bit line and divided bit line at a single refreshing time is 76.8 mA; here, the source voltage Vdd is 5 V and precharge voltage is Vdd/2. In this case, the dissipation current of the divided bit line is 15.36 mA. That is, the dissipation current of the main bit line pair is five times as large as the dissipation current of the divided bit line.

SUMMARY OF THE INVENTION

It is therefore an object of the present invention to provide a new and improved divided bit line type dynamic semiconductor memory device which has a higher memory integration and a lower dissipation power.

It is another object of this invention to provide a new and improved divided bit line type dynamic semiconductor memory device which has a higher memory integration and a lower dissipation power, and can operate at a high speed.

In accordance with the above objects, this invention is addressed to a specific divided bit line dynamic semiconductor memory device, which comprises plural pairs of parallel main bit lines, plural pairs of divided bit lines provided to each of the main bit line pairs, parallel word lines insulatively crossing the divided bit line pairs, and memory cells provided at cross points between the divided bit line pairs and word lines and constituting a memory cell matrix. First sense amplifier circuits are coupled to the respective divided bit line pairs, whereas second sense amplifier circuits are coupled to the respective main bit line pairs. First switching transistor sections are coupled between the divided bit line pairs and main bit line pairs and serve as transfer gates that are selectively rendered conductive. Second switching transistor sections are coupled between the main bit line pairs and second sense amplifier circuits and serve as transfer gates that are also selectively rendered conductive.

The present memory device is featured in its gate controller. In the read mode and in the case where a certain one of the aforementioned memory cells is selected, the gate controller (1) electrically connects the selected divided bit line pair including this selected cell to a specific main bit line pair associated therewith to thereby transfer the stored data of the selected cell to the specific main bit line pair, and (2) controls the electric statuses of the first and second transistor sections in such a way as to electrically disconnect this specific main bit line pair from the second sense amplifier circuit provided at the specific main bit line pair to amplify the selected cell data as well as from the aforementioned selected divided bit line pair before the specific main bit line pair completes its full potential change to have the upper limit or lower limit voltage of the full potential variation range that is defined by the source voltage and the ground potential, whereby the specific main bit line pair has its potential swung within a restricted potential variation range determined in advance to be narrower than the full potential variation range, thus ensuring reduction of the charging/discharging current flowing through the specific main bit line pair and high speed memory accessing.

This invention and its objects and advantages will become more apparent from the detailed description of preferred embodiments presented below.

BRIEF DESCRIPTION OF THE DRAWINGS

In the following detailed description, reference is made to the accompanying drawings in which.

DETAILED DESCRIPTION OF THE PREFERRED EMBODIMENTS

Figure 1:
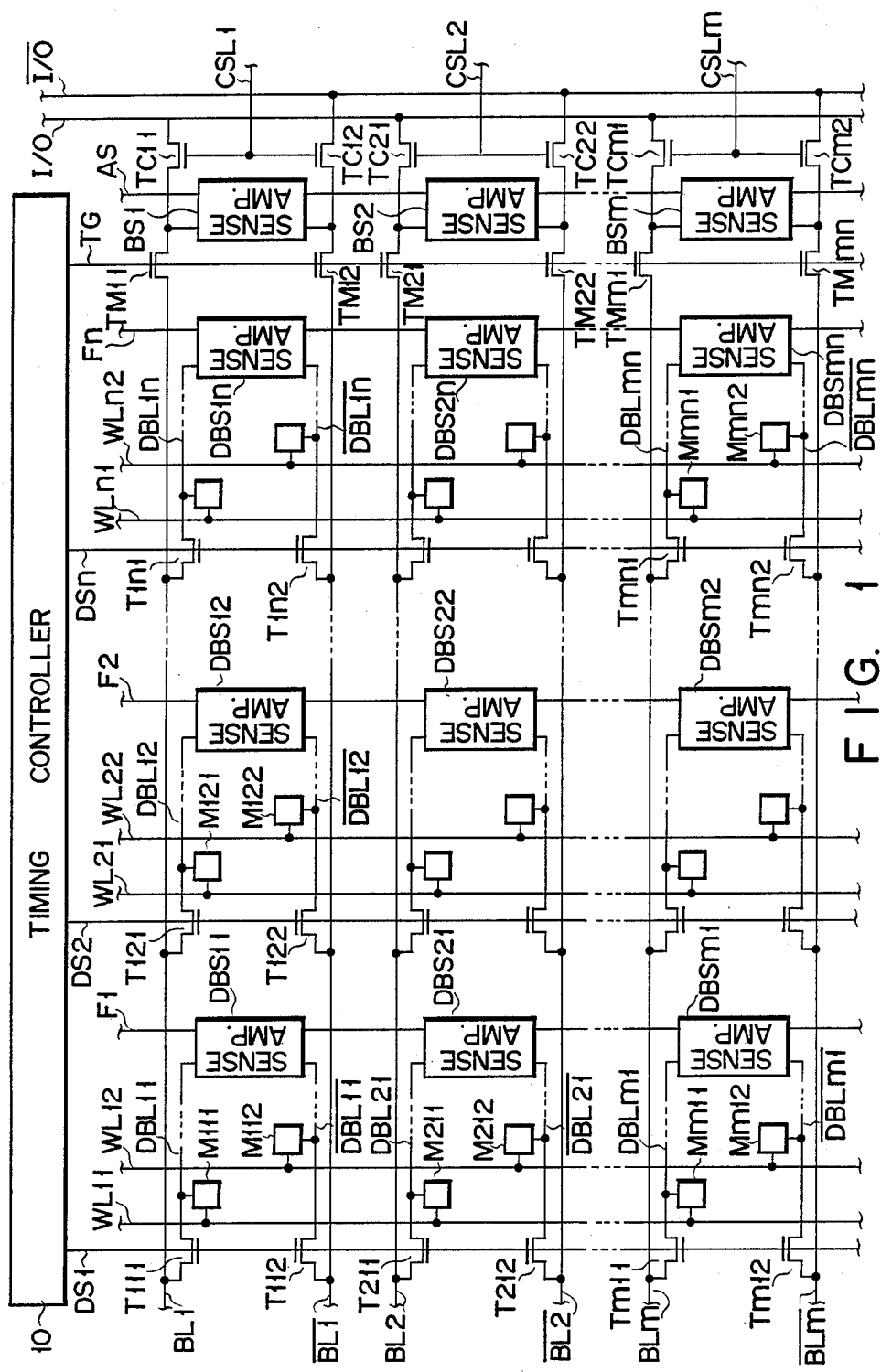
FIG. 1 is a diagram illustrating the circuit configuration of the essential section of a divided bit line type random access memory (dRAM) according to one preferred embodiment of this invention.

FIG. 1 illustrates the circuit configuration of the essential section of a divided bit line type dRAM according to one preferred embodiment of this invention. Plural pairs of parallel main bit lines BLi and $\overline{BL}i$ (i=1, 2, ..., m) are provided on a chip substrate (not shown). In FIG. 1 only the first, second and m-th main bit line pairs are illustrated for diagrammatic simplicity. Each main bit line pair BLi and $\overline{BL}i$ is provided with a predetermined number of pairs of divided bit lines DBLij and $\overline{DBL}ij$ (j=1, 2, ..., n). These divided bit lines will be called "sub-bit lines" or "sub-bit line pairs" in the following description.

Each pair of sub-bit lines DBLij and $\overline{DBL}ij$ is coupled to the respective main bit line pair BLi and $\overline{BL}i$ through switching transistors such as MOSFET's that serve as transfer gates. For example, first sub-bit line pair DBL11 and $\overline{DBL}11$ is coupled to the respective main bit line pair BL1 and $\overline{BL}1$ through MOSFET's T111 and T112 serving as transfer gates. These MOSFET's T111 and T112 are coupled at their gate electrodes to a sub-bit line pair select line DS1 which is also coupled to gate electrodes of transfer gate FET's T211, T212, ..., Tm11, Tm12 provided at sub-bit line pairs of other main bit line pairs. Second sub-bit line pair DBL12 and $\overline{DBL}12$ are coupled through MOSFET's T121 and T122 to this sub-bit line pair BL1 and $\overline{BL}1$. These FET's T121 and T122 are coupled at their gate electrodes to a sub-bit line pair select line DS2. The n-th sub-bit line pair DBLln and $\overline{DBL}ln$ are coupled through MOSFET's T1n1 and T1n2 to the main bit line pair BL1 and $\overline{BL}1$. These FET's T1n1 and T1n2 are coupled at their gate electrodes to a sub-bit line pair select line DSn. The above connection applies to the other main bit line pairs, so that their redundant description will be omitted here.

When one select line DSj is selected, all the transfer gates coupled to this line are simultaneously opened (i.e., FET's are rendered conductive), thereby electrically connecting an array of sub-bit line pairs to the associated main bit line pairs. Given that select line DS1 is selected, transfer gates T111, T112, T211, T212, ..., Tm11, Tm12 are simultaneously opened, and one array of sub-bit line pairs DBL11, $\overline{DBL}11$, DBL21, $\overline{DBL}21$, ..., DBLm1, $\overline{DBL}m1$ are electrically coupled to the associated main bit line pairs as a consequence. A sense amplifier BSi for main bit line pair is provided to each main bit line pair. These sense amplifiers BS are each basically constituted by a well-known flip-flop circuit using two MOSFET's. As shown in FIG. 1, sense amplifiers BS are coupled to a single sense amplifier control line AS, and they are simultaneously activated for sensing operation in response to an activate control signal supplied from this control line AS.

Parallel word lines WL are so provided as to insulatively cross the aforementioned sub-bit line pairs DBL. These word lines WL are divided into a certain number of groups which corresponds to the number of sub-bit line pairs, each group consisting of a predetermined number of word lines WLj1, WLj2, .... For instance, word lines WL11, WL12, ... cross first sub-bit line pairs DBL11, $\overline{DBL}11$, DBL21, $\overline{DBL}21$, ..., DBLm1, $\overline{DBL}m1$. Memory cells M are provided at the respective cross points between sub-bit line pairs DBL and word lines WL. For instance, memory cell M111 is provided at the cross point between sub-bit line DBL11 and word line WL11, and memory cell M112 at the cross point between sub-bit line $\overline{DBL}11$ and word line WL12. With regard to first sub-bit line pair DBL21, $\overline{DBL}21$ of second main bit line pair BL2 $\overline{BL}2$, memory cell M211 is provided at the cross point between sub-bit line DBL11 and word line WL11, and memory cell M212 at the cross point between sub-bit line $\overline{DBL}21$ and word line WL12. Each sub-bit line pair is provided with a single dummy cell (not shown). As is well known, each of the memory cells and dummy cells is constituted by one transistor and one capacitor.

As shown in FIG. 1 a sense amplifier for sub-bit line pair (hereinafter called "subsense amplifier") DBij is provided to each of sub-bit line pair DBL. The first array of subsense amplifiers DBS11, DBS21, ..., DBSml are coupled to a subsense amplifier control line Fl and are simultaneously rendered active in response to the activate control signal supplied from the control line F1. Similarly, the second array of subsense amplifiers DBS12, DSB22, ..., DBSm2 are coupled to a subsense amplifier control line F2 and are simultaneously rendered active in response to the activate control signal supplied from the control line F2. The n-th array of subsense amplifiers DBS1n, DBS2n, ..., DBSmn are coupled to a subsense amplifier control line Fn and are simultaneously rendered active in response to the activate control signal from the control line Fn.

Each main bit line pair WLi and $\overline{WL}i$ is coupled to the associated main sense amplifiers BSi through switching transistors (such as MOSFET's) TMi1 and TMi2 serving as transfer gates. These FET's are coupled at their gate electrodes to a control line TG. When a gate open control signal is supplied onto control line TG, these transfer gates TM are simultaneously opened, thereby electrically connecting all the main bit line pairs BL to the associated main sense amplifiers BS. Each main sense amplifier BS is coupled to an input/output lines I/O and $\overline{I}/$ through MOSFET's TCi1 and TCi2 that serve as a column select gate section. MOSFET's TCi1 and Tci2 are coupled together at their gate electrodes and are also coupled to a column line CSLi thereat.

Sub-bit line transfer gate control lines DS1, DS2, ..., DSn and main bit line transfer gate control line TG are coupled to a timing controller 10 that includes a clock generator (not shown). Timing controller 10 is so designed as to generate a proper gate control signal at the proper timing in order to control the gate opening operation of transfer gate transistors T and TM.

Figure 2:
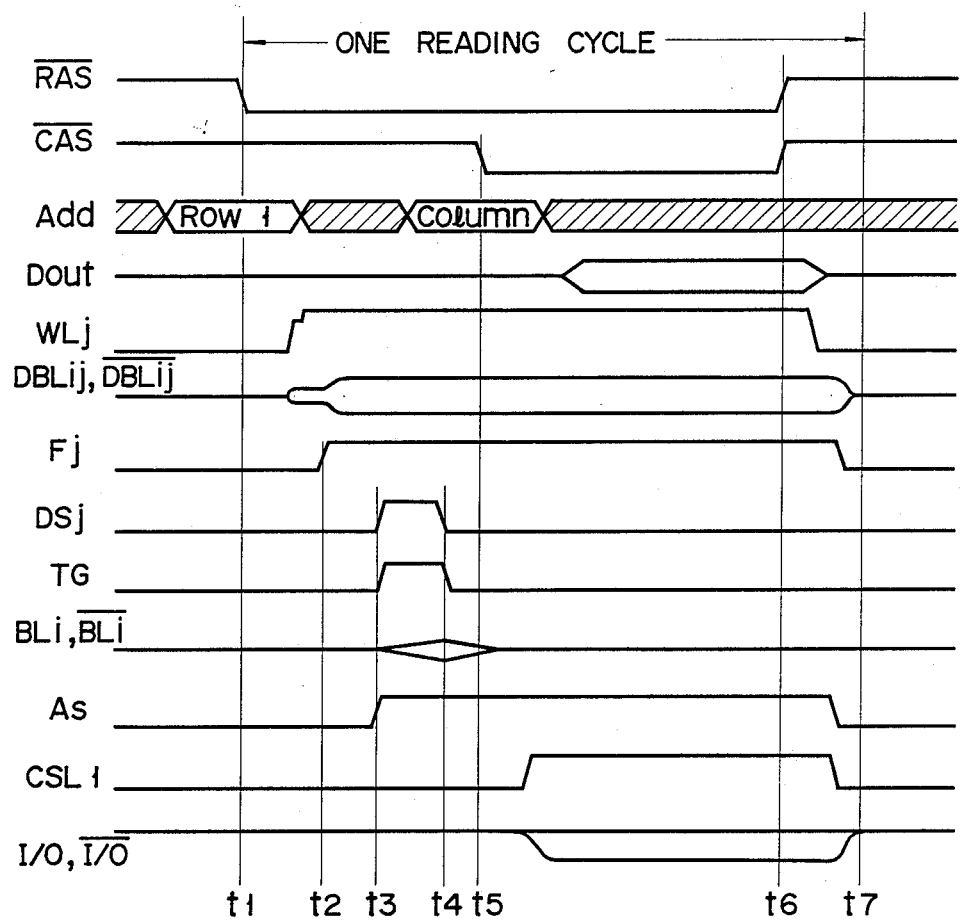
FIG. 2 is a diagram illustrating waveforms of major voltage signals that are generated from the essential section of the divided bit line type dRAM of FIG. 1 in the data read mode.

Referring now to FIG. 2, a detailed description will be given of the data read operation of thus constituted divided bit line type dRAM. According to this embodiment, the precharge voltage Vpc of the main bit line pair and sub-bit line pair is set to be a half of the source voltage Vdd (=Vdd/2). The following description will be given with reference to the case where memory cell M111 is selected and stored data of this selected cell M111 should be read out. In the initial mode, all the sub-bit line transfer gates T and all the main bit line transfer gates TM are rendered nonconductive (or closed).

As shown in FIG. 2, when a row address strobe signal $\overline{RAS}$ changes its level to "L" from "H" at a time t1, this dRAM is rendered active. In the active duration, a row address buffer (not shown) operates, and an externally set row address is supplied to the interior of the chip of the dRAM to thereby select associated word lines. With the row address being "11," word line WL11 is selected, and at this time the potential of this word line WL11 rises to a booster potential (=3Vdd/2) from the qround potential.

When a subsense amplifier activate signal Fj (j=1) is input at the subsequent time t2, subsense amplifiers DBS11, DBS21, ..., DBSml provided at sub-bit line pairs DBL11, $\overline{DBL11}$, DBL21, $\overline{DBL21}$, ..., DBLml, $\overline{DBLml}$ are simultaneously rendered activate. As a result, sub-bit line pairs DBLil and $\overline{DBLil}$ (=DBL11, $\overline{DBLi}$, DBL21, $\overline{DBL21}$, ..., DBLml, $\overline{DBLml}$) which have been precharged to have the precharge voltage Vpc are rendered to have either the source voltage Vdd or ground potential Vss in accordance with the stored data.

Subsequently, when a sub-bit line pair select signal DSj (j=1) is input at a time t3, that is, when the potential of sub-bit line DS1 is changed to the source voltage Vdd from the ground potential Vss, all the transfer gate transistors T111, T112, T211, T212, ..., Tm11, Tm12 coupled to this select line DS1 are simultaneously rendered conductive. Accordingly, sub-bit line pairs DBL11, $\overline{DBL11}$, DBL21, $\overline{DBL21}$, ..., DBLml, $\overline{DBLm}$ are electrically coupled to associated main bit line pairs BL1, $\overline{BL1}$, BL2, $\overline{BL2}$, ..., BLm, $\overline{BLm}$. The data potential of each of the sub-bit line pairs is transferred to the associated main bit line pair BLi, $\overline{BLi}$.

At the time t3, the potential of main bit line transfer gate control line TG is changed to the source voltage Vdd from the ground potential Vss. In response to this potential change, main transfer gates TM are simultaneously rendered conductive. At the time t3, the potential of sense amplifier control line AS is changed to source voltage Vdd from the ground potential Vss. In response to this potential change, main sense amplifiers BS are simultaneously rendered active. Consequently, the data voltages respectively supplied to main bit line pairs BL, $\overline{BL}$ are amplified by the respective main sense amplifiers BS. Each of these main bit line pairs is amplified to have the voltage Vpc+α or Vpc−α, and then, sub-bit line select signal DS1 and main bit line transfer gate activate signal TG are changed to have the ground potential Vss from the source voltage Vdd at a time t4. As a result, the aforementioned transfer gate transistors T111, T112, T211, T212, ..., Tm11, Tm12 are rendered nonconductive and main transfer gate transistors TM are rendered nonconductive. Accordingly, the selected sub-bit line pairs DBL11, $\overline{DBL11}$, DBL21, $\overline{DBl21}$, ..., DBLml, $\overline{DBLml}$ are electrically disconnected from main bit line pairs BL1, $\overline{BL1}$ BL2, $\overline{BL2}$, ..., BLm, $\overline{BLm}$, which are electrically disconnected from the associated main subsense amplifiers BS.

Under this circumstance, when a change c in precharge voltage Vpc of each main bit line pair BLi and $\overline{BLi}$ is about 1/5 of the source voltage Vdd (=Vdd/5), main sense amplifier BSi can sufficiently sense this potential change. While each main bit line pair BLi and $\overline{BLi}$ causes such a small potential change (i.e., before the main bit line pair completes its potential change in the full range to be equal to either the source voltage Vdd or ground potential Vss), this main bit line pair can be forcibly disconnected from the associated main sense amplifier BSi, thus reducing the charging/discharging current as well as the dissipation power of the dRAM. This also contributes to increasing the sensing operation of the dRAM since the data restoring in the memory cells M111, M211, ..., Mm11 coupled to the selected word line WLII and the latching of the data voltage by main sense amplifiers BS are rapidly executed. In this case, even with the change α being about 1/10 of the source voltage Vdd (=Vdd/10), main sense amplifier BSi can sufficiently sense such a minute potential change. The absolute value |Δ Vb| of this potential change α can be expressed as follows:

$$100 \text{ mV} \leq |\Delta Vb| \leq 500 \text{ mV}.$$

When the selected sub-bit line pairs DBL11, $\overline{DBL11}$, DBL21, $\overline{DBL21}$, ..., DBLml, $\overline{DBLml}$ are electrically disconnected from main bit line pairs BL1, $\overline{BL1}$, BL2, $\overline{BL2}$, ..., BLm, $\overline{BLm}$ and when these main bit line pairs are electrically disconnected from main sense amplifiers BS, these main bit line pairs are subjected to precharging by a well-known pre-charging circuit (not shown to have its potential returned to the precharge voltage Vpc. The above is the refreshing operation.

When the level of a column address strobe signal ($\overline{CAS}$) is changed to level "L" from level "H" at a time t5 as shown in FIG. 1, a column address buffer (not shown) starts operating and an externally supplied column address signal is transferred within the chip as a consequence. Since memory cell Mlll is the selected target cell for data readout, this column address is "1". In this case, the first column select line CSLI is selected. When the potential of column select line CSLI rises to the source voltage Vdd from the ground potential Vss with a slight time delay, column transfer gates TC11 and TC12 are turned on or rendered conductive. Consequently, read data latched in main bit line sense amplifier BSl (or the stored data of selected cell M111) is transferred to input/output lines I/0 and $\overline{I}$/, whereby the read data is output.

Finally, when row address strobe signal $\overline{RAS}$ and column address strobe signal $\overline{CAS}$ simultaneously rise to the logic level "H" from the logic level "L" (or when the levels of these signals return to the logic level "H") at a time t6, the selected word line WL11 and selected column select line CSL1 are reset, and sub-bit line pairs DBL11, $\overline{DBL11}$, DBL21, $\overline{DBL21}$, ..., DBLm12, DBLml, main bit line sense amplifiers BS and input/output lines I/0 and $\overline{I}$/ are simultaneously pre-charged. This pre-charging is completed at a time t7. Here, one cycle of the data reading operation for the dRAM is completed.

With such an arrangement, in the read mode for the divided bit line type dRAM and in the case where stored data is read out from the selected certain memory cell, a main bit line pair is simultaneously and forcibly rendered nonconductive (or turned off) by means of main transfer gates TM and subtransfer gates T111, T211, ..., Tm11, before the main bit line pair completes its full swinging to have the potential corresponding to the full range as defined by the source voltage Vdd and ground potential Vss. Accordingly, the main bit line pairs BL and $\overline{BL}$ are simultaneously disconnected from sub-bit line pairs DBL11, $\overline{DBL11}$, DBL21, $\overline{DBL21}$, ...

, DBLml, $\overline{\text{DBLml}}$ and main sense amplifiers BS associated therewith. In this case, main bit line pairs BL and $\overline{\text{BL}}$ are permitted to change their potentials only within a restricted range narrower than the full range defined by the source voltage Vdd and ground potential Vss and the amplitude of these potential changes. In other words, before the potential difference of each main bit line pair becomes equal to the full potential difference as defined by the source voltage Vdd and ground potential Vss, the sensing operation of the associated main sense amplifier BSi and subsense amplifier DBSil associated therewith is completed. The inhibition of the full potential swinging of the main bit line pair reduces the charging/discharging current flowing through this main bit line pair and reduces the dissipation power of the dRAM as a consequence. For instance, by properly setting the potential change $\alpha$ in consideration of the sensitivities and operational margins of the main and subsense amplifiers, the dissipation power of the divided bit line type dRAM of this invention can be significantly reduced to be equal to or less than 1/5 of the dissipation power of the conventional divided bit line type dRAM. The inhibition of the full potential swinging of the main bit line pair further contributes to increasing the sensing operation, thus ensuring reduction of the data read time for the dRAM. For instance, it is expected that the data read time for the present divided bit line type dRAM becomes ½ or less than that of the conventional divided bit line type dRAM.

Even in the restoring mode of the dRAM, under the control of the timing controller, each main bit line pair completes its full potential swinging to have the potential difference corresponding to the full range defined by the source voltage Vdd and ground potential Vss, main transfer gates TM11, TM12, TM21, TM22, ..., TMm1, TMm2 and subtransfer gates T111, T112, T211, T212, ..., Tm11, Tm12 are forcibly rendered nonconductive (or turned off). Accordingly, main bit line pairs BL and $\overline{\text{BL}}$ are simultaneously are simultaneously disconnected from sub-bit line pairs DBL and $\overline{\text{DBL}}$ and main sense amplifiers BS associated therewith. In this case too, as described earlier, it is possible to restrict the amplitude of the potential change of main bit line pairs BL and $\overline{\text{BL}}$ to thereby reduce the dissipation of dRAM as well as increase the restoring operation of the dRAM.

Although the invention has been described with reference to a specific embodiment, it shall be understood by those skilled in the art that numerous modifications may be made within the spirit and scope of the inventive contribution.

Figure 3:
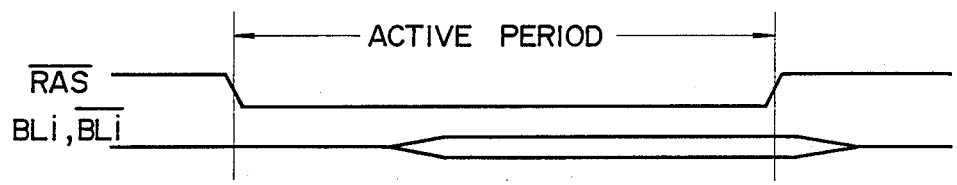
FIG. 3 is a diagram illustrating the waveforms of major voltage signals that are generated, in the data read mode, from the essential section of a divided bit line type dRAM according to another embodiment.

For instance, in the above embodiment, the bit line pre-charging operation is executed during the active duration of the row address strobe signal $\overline{\text{RAS}}$. As shown in FIG. 3, however, this pre-charging operation may be executed after the active duration of the signal $\overline{\text{RAS}}$. In this case, the main bit line pair BLi and $\overline{\text{BLi}}$ including the selected cell keeps storing the read data during the active duration in which the signal $\overline{\text{RAS}}$ has a logic level of "L". The pre-charging is executed after the level of the signal $\overline{\text{RAS}}$ is changed to "H" from "L".

What is claimed is:

1. A dynamic semiconductor memory device comprising:
   (a) a plurality of parallel main bit line pairs formed on a substrate;
   (b) a plurality of sub-bit line pairs provided on each of said main bit line pairs;
   (c) parallel word lines insulatively crossing said sub-bit line pairs;
   (d) memory cells provided at cross points between said sub-bit line pairs and said word lines to constitute a memory cell matrix;
   (e) first sense amplifier circuits respectively connected to said sub-bit line pairs;
   (f) second sense amplifier circuits respectively connected to said main line pairs; and
   (g) electrical circuit means for, when a certain one of said memory cells is selected as a selected cell, electrically connecting a selected sub-bit line pair including said selected cell to a main bit line pair associated with said selected sub-bit line pair thereby to transfer a stored data of said selected cell to said main bit line pair, and for electrically disconnecting said main bit line pair from said second amplifier circuit provided therefor so as to amplify the transferred data and said selected sub-bit line pair before said main bit line pair completes its full range potential variation.

2. The device according to claim 1, wherein said electrical circuit means comprises:
   controller means for electrically and simultaneously disconnecting said main bit line pair from said second sense amplifier circuit thereof and said selected sub-bit line pair before said main bit line pair completes such a full potential change as to have an upper limit voltage and a lower limit voltage of a full potential variation range which is defined by a source voltage and a ground potential of said device, whereby said main bit line pair has a potential swinging within a restricted potential variation range which is narrower than said full potential variation range.

3. The device according to claim 2, wherein said controller means comprises:
   first transfer gate sections connected between said sub-bit line pairs including said selected sub-bit line pair and said main bit line pairs including said specific main bit line pair;
   second transfer gate sections coupled between said main bit line pairs and said second sense amplifier circuits; and
   timing controller means, coupled to said first and second transfer gate sections, for rendering nonconductive said first transfer gate section of said selected sub-bit line pair and said second transfer gate section of said specific main bit line pair before said specific main bit line pair completes said full potential change.

4. The device according to claim 3, wherein said timing controller means substantially simultaneously renders nonconductive said first transfer gate section of said selected sub-bit line pair and said second transfer gate section of said specific main bit line pair.

5. The device according to claim 4, wherein said restricted potential variation range of said specific main bit line pair is substantially equal to or narrower than 1/5 of said full potential variation.

6. The device according to claim 5, wherein said restricted potential variation range of said specific main bit line pair is substantially equal to or narrower than 1/10 of said full potential variation.

7. The device according to claim 4, wherein said restricted potential variation range of said specific main bit line pair has an absolute value $|\Delta Vb|$ set as follows:

$$100\ mV \leq |\Delta Vb| \leq 500\ mV.$$

8. A divided bit line type dynamic semiconductor memory device operating on a source voltage and a ground potential comprising:
(a) main bit line pairs;
(b) divided bit line pairs provided at each of said main bit line pairs;
(c) word lines insulatively crossing said divided bit line pairs;
(d) memory cells provided at cross points between said divided bit line pairs and said word lines to form a memory cell matrix;
(e) first sense amplifier circuits respectively coupled to said divided bit line pairs;
(f) second sense amplifier circuits respectively coupled to said main bit line pairs;
(g) first switching transistor means, coupled between said divided bit line pairs and said main bit line pairs, for serving as transfer gates that are selectively rendered conductive;
(h) second switching transistor means, coupled between said main bit line pairs and said second sense amplifier circuits, for serving as transfer gates that are selectively rendered conductive; and
(i) control means, coupled to said first and second switching transistor means, for, when a certain one of said memory cells is selected as a selected cell in a read mode of said device, electrically connecting a selected divided bit line pair including said selected cell to a specific main bit line pair associated therewith to thereby transfer stored data of said selected cell to said specific main bit line and for controlling electric statuses of said first and second switching transistor means in such a way as to electrically disconnect said specific main bit line pair from said second sense amplifier circuit provided at said specific main bit line pair to amplify said transferred data and said selected divided bit line pair, before said specific main bit line pair completes a full potential change to have upper and lower limit voltages of a full potential variation range defined by said source voltage and said ground potential.

9. The device according to claim 8, wherein said control means controls, even in a restoring mode of said device, said electric statuses of said first and second switching transistor means in such a way as to electrically disconnect said specific main bit line pair from said second sense amplifier circuit of said specific main bit line pair and said selected sub-bit line pair, before said specific main bit line pair completes a full potential change to have said upper and lower limit voltages of said full potential variation range.

10. The device according to claim 9, wherein each of said divided bit line pairs has first and second sub-bit lines, and wherein said first switching transistor means includes first and second transistors respectively coupled to said first and second sub-bit lines.

11. The device according to claim 10, wherein each of said main bit line pairs has first and second main bit lines coupled through said first and second transistors to said first and second sub-bit lines.

12. The device according to claim 11, wherein said second switching transistor means includes third and fourth transistors respectively coupled to said first and second main bit lines.

13. The device according to claim 12, wherein said first to fourth transistors are voltage-controlled transistors having gate electrodes coupled to said control means.

14. A method of driving a divided bit line type dynamic semiconductor memory device, said method comprising the steps of:
(a) specifying a certain word line to be coupled to a selected memory cell from a plurality of word lines;
(b) activating sense amplifier circuits coupled to selected divided bit line pairs including specific memory cells including said selected cell and provided at associated main bit line pairs;
(c) rendering conductive subtransfer gate sections provided at said selected divided bit line pairs to electrically connect said selected divided bit line pairs to said main bit line pairs, so that data voltages stored in said specific memory cells are transferred to said main bit line pairs
(d) rendering conductive main transfer gate sections provided at said main bit line pairs to electrically connect said main bit line pairs to main sense amplifier circuits, thereby activating said main sense amplifier circuits;
(e) electrically disconnecting said main bit line pairs from said main sense amplifier circuits and said selected divided bit line pairs before each of said main bit line pairs completes a full potential change to have upper and lower limit voltages of a full potential variation range defined by a source voltage and a ground potential of said device; and
(f) specifying a specific main bit line pair having said selected cell and electrically connecting only said specific main bit line pair to input/output lines, whereby stored data of said selected cell is read out from said input/output lines.

15. The method according to claim 14, wherein said main bit line pairs have a potential swinging within a restricted potential variation range predetermined to be narrower than said full potential variation range, so that a charging/discharging current flowing through said specific main bit line pairs is reduced and an operation speed of said device is increased.

16. The method according to claim 15, wherein said restricted potential variation range is substantially equal to or narrower than 1/5 of said full potential variation.

17. The method according to claim 16, wherein said restricted potential variation range is substantially equal to or narrower than 1/10 of said full potential variation.

18. The method according to claim 16, wherein said restricted potential variation range of said specific main bit line pair has an absolute value $|\Delta Vb|$ set as follows:

$$100\ mV \leq |\Delta Vb| \leq 500\ mV.$$

* * * * *